US005399238A

United States Patent [19]

Kumar

[11] Patent Number: 5,399,238
[45] Date of Patent: * Mar. 21, 1995

[54] METHOD OF MAKING FIELD EMISSION TIPS USING PHYSICAL VAPOR DEPOSITION OF RANDOM NUCLEI AS ETCH MASK

[75] Inventor: Nalin Kumar, Austin, Tex.

[73] Assignees: Microelectronics and Computer Technology Corporation, Austin; SI Diamond Technology, Inc., Houston, both of Tex.

[*] Notice: The portion of the term of this patent subsequent to May 17, 2011 has been disclaimed.

[21] Appl. No.: 232,790

[22] Filed: Apr. 22, 1994

Related U.S. Application Data

[63] Continuation-in-part of Ser. No. 52,958, Apr. 23, 1993, Pat. No. 5,312,514, which is a continuation of Ser. No. 789,220, Nov. 7, 1991, abandoned.

[51] Int. Cl.⁶ .............................................. H01J 9/00
[52] U.S. Cl. ................... 156/643; 156/655; 156/656; 156/659.1; 156/657; 204/192.15; 204/192.35; 445/50; 445/51
[58] Field of Search ............... 156/643, 647, 655, 656, 156/659.1, 657; 204/192.15, 192.35; 445/51, 50; 427/248.1, 249, 250

[56] References Cited

U.S. PATENT DOCUMENTS

| | | | |
|---|---|---|---|
| 2,959,704 | 11/1960 | Snell et al. | 313/309 |
| 3,625,758 | 12/1971 | Stahl et al. | 117/212 |
| 3,894,332 | 7/1975 | Nathanson et al. | 313/336 |
| 3,947,716 | 3/1976 | Fraser, Jr. et al. | 313/336 |
| 3,970,887 | 7/1976 | Smith et al. | 313/309 |
| 3,998,678 | 12/1976 | Fukase et al. | 156/3 |
| 4,115,228 | 9/1978 | Heinrich et al. | 156/156 X |
| 4,139,773 | 2/1979 | Swanson | 250/423 |
| 4,307,507 | 12/1981 | Gray et al. | 29/580 |
| 4,350,926 | 9/1982 | Shelton | 313/455 |
| 4,465,551 | 8/1984 | Horwitz | 156/643 |
| 4,566,937 | 1/1986 | Pitts | 156/643 X |
| 4,612,085 | 9/1986 | Jelks et al. | 156/643 |
| 4,663,559 | 5/1987 | Christersen | 313/336 |
| 4,685,996 | 8/1987 | Busta et al. | 156/628 |
| 4,764,485 | 8/1988 | Loughran et al. | 437/225 |
| 4,806,202 | 2/1989 | Tang et al. | 156/657 |
| 4,855,636 | 8/1989 | Busta et al. | 313/306 |
| 4,895,735 | 1/1990 | Cook | 427/43.1 |
| 4,933,108 | 6/1990 | Soredal | 252/518 |
| 4,943,343 | 7/1990 | Bardai et al. | 156/643 |
| 4,964,946 | 10/1990 | Gray et al. | 156/643 |
| 4,968,382 | 11/1990 | Jacobson et al. | 156/156 X |
| 4,973,378 | 11/1990 | Lee et al. | 156/156 X |
| 5,019,003 | 5/1991 | Chason | 445/24 |
| 5,035,768 | 7/1991 | Mu et al. | 156/156 X |
| 5,104,684 | 4/1992 | Tao et al. | 427/38 |
| 5,129,850 | 7/1992 | Kane et al. | 445/24 |
| 5,141,460 | 8/1992 | Jaskie et al. | 445/24 |
| 5,147,823 | 9/1992 | Ishibashi et al. | 437/225 |
| 5,156,997 | 10/1992 | Kumar et al. | 437/183 |
| 5,180,951 | 1/1993 | Dworsky et al. | 315/169.3 |
| 5,185,178 | 2/1993 | Koskenmaki | 427/585 |
| 5,196,102 | 5/1993 | Kumar | 427/528 |
| 5,220,725 | 6/1993 | Chan et al. | 156/659.1 X |
| 5,244,538 | 9/1993 | Kumar | 156/643 |
| 5,290,732 | 3/1994 | Kumar et al. | 437/183 |
| 5,312,514 | 5/1994 | Kumar | 156/643 |

OTHER PUBLICATIONS

Maissel and Glang, *Handbook of Thin Film Technology*, 1983 Reissue, McGraw-Hill, New York, NY.

Cade and Lee, "Vacuum Microelectronics", *GEC J. Res. Inc.*, Marconi Rev., 7(3), 129(1990).

Horwitz, McPhedran and Beunan, "Interference and diffraction in globular metal films", *Journal of the Optical Society of America*, vol. 68, No. 8, Aug. 1978, pp. 1023-1031.

Horwitz, "A new vacuum-etched high-transmittance (antireflection)film", *Applied Physics Letters* vol. 36, No. 9, May 1, 1980, pp. 727-730.

*Primary Examiner*—Thi Dang
*Attorney, Agent, or Firm*—David M. Sigmond

[57] ABSTRACT

A method of making sub-micron low work function field emission tips without using photolithography. The method includes physical vapor deposition of randomly located discrete nuclei to form a discontinuous etch mask. In one embodiment an etch is applied to low work function material covered by randomly located nuclei to form emission tips in the low work function material. In another embodiment an etch is applied to base material covered by randomly located nuclei to form tips in the base material which are then coated with low work function material to form emission tips. Diamond is the preferred low work function material.

23 Claims, 3 Drawing Sheets

METHOD OF MAKING FIELD EMISSION TIPS USING PHYSICAL VAPOR DEPOSITION OF RANDOM NUCLEI AS ETCH MASK

CROSS-REFERENCE TO RELATED APPLICATIONS

This is a continuation-in-part of U.S. application Ser. No. 08/052,958, filed Apr. 23, 1993, now U.S. Pat. No. 5,312,514; which is a continuation of abandoned U.S. application Ser. No. 07/789,220, filed Nov. 7, 1991. Such applications and the disclosures therein are hereby incorporated by reference.

BACKGROUND OF THE INVENTION

1. Field of the invention

The invention relates to a method of making field emission tips using randomly located discrete nuclei deposited by physical vapor deposition as an etch mask.

2. Description of Related Art

Field emitters are widely used in ordinary and scanning electron microscopes since emission is affected by the adsorbed materials. Field emitters have also been found useful in flat panel displays and vacuum microelectronics applications. Cold cathode and field emission based flat panel displays have several advantages over other types of flat panel displays, including low power dissipation, high intensity and low projected cost.

The present invention can be better appreciated with an understanding of the related physics. General electron emission can be analogized to the ionization of a free atom. Prior to ionization, the energy of electrons in an atom is lower than electrons at rest in a vacuum. In order to ionize the atom, energy must be supplied to the electrons in the atom. That is, the atom fails to spontaneously emit electrons unless the electrons are provided with energy greater than or equal to the electrons at rest in the vacuum. Energy can be provided by numerous means, such as by heat or irradiation with light. When sufficient energy is imparted to the atom, ionization occurs and the atom releases one or more electrons.

Several types of electron emissions are known. Thermionic emission involves an electrically charged particle emitted by an incandescent substance (as in a vacuum tube or incandescent light bulb). Photoemission releases electrons from a material by means of energy supplied by incidence of radiation, especially light. Secondary emission occurs by bombardment of a substance with charged particles such as electrons or ions. Electron injection involves the emission from one solid to another. Finally, field emission refers to the emission of electrons due to an electric field.

In field emission (or cold emission), electrons under the influence of a strong electric field are liberated out of a substance (usually a metal or semiconductor) into a dielectric (usually a vacuum). The electrons "tunnel" through a potential barrier instead of escaping "over" it as in thermionics or photoemission. Field emission is therefore a quantum-mechanics phenomena with no classical analog. A detailed explanation of field emission quantum mechanics is beyond the scope of the discussion herein. Nevertheless, field emitters have been extensively studied and are well known in the art. See generally, P. H. Cutler and T. T. Tsong, *Field Emission and Related Topics*, 1978.

The shape of a field emitter effects its emission characteristics. Field emission is most easily obtained from sharply pointed needles or tips whose ends have been smoothed into a nearly hemispherical shape by heating. Tip radii as small as 100 nanometers have been reported. As an electric field is applied, the electric lines of force diverge radially from the tip and the emitted electron trajectories initially follow these lines of force. Devices with such sharp features similar to a "Spindt cathode" have been previously invented. An overview of vacuum electronics and Spindt type cathodes can be found in the November and December, 1989 issues of *IEEE-Transactions of Electronic Devices*. Fabrication of such fine tips, however, normally requires extensive fabrication facilities to finely tailor the emitter into a conical shape. It can be difficult to build high-performance large-area field emitters (i.e. more than a few sources per square micron area) since the cone size is limited by the lithographic equipment. It is also difficult to perform fine feature photolithography on large area substrates as required by flat panel display type applications. Thus, photolithography often significantly increases both the cost and complexity of the process.

The work function of the electron emitting surface or emission tip of a field emitter also affects emission characteristics. The work function is the voltage (or energy) required to extract or emit electrons from a surface. The lower the work function, the lower the voltage required to produce a particular amount of emission.

Prior attempts to fabricate field emitter devices have included the following:

U.S. Pat. No. 3,947,716 describes enhancing emission quality by altering the molecular structure of a tip to lower the work function of the planes where increased adsorption is desired, and increasing the work function in regions where less adsorption is desired. The molecular alteration is accomplished with thermal field buildup by subjecting the emitter tip to heating pulses in the presence of an electrostatic field to cause surface migration of the tip atoms along the field lines.

U.S. Pat. No. 3,970,887 describes a semiconductor substrate with integral field emitter tips in which an insulating layer and conductive layer are provided with openings at the tips to form micro-anode structures for each tip. The tips are electrically isolated from one another by initially doping the substrate to provide opposite conductivity-type regions at each tip.

U.S. Pat. No. 3,998,678 describes making field emitters by forming a metal layer on a substrate, forming conical emitters on the metal, forming an insulating layer with height equal to the emitters, forming another metal layer as an accelerating electrode, and etching he insulating layer to expose the emitters.

U.S. Pat. No. 4,307,507 describes making field emitters by selectively masking a single crystal substrate so that the unmasked regions define islands, orientation-dependent etching the substrate to from holes whose sides intersect at a crystallographically sharp point, removing the mask, covering the substrate and filling the holes with an emissive material, and etching the substrate to expose sharp emission tips.

U.S. Pat. No. 4,685,996 describes making field emitters by anisotropically etching a single crystal silicon substrate through photoresist openings to form funnel shaped protrusions thereon, then conformally depositing a refractory metal onto the protrusions.

U.S. Pat. No. 4,933,108 describes making field emitters by coating a metal carrier wire with crystals of an oxide compound which has a metallic luster and which is a compound transition metal selected from the group of tungsten, molybdenum, niobium, vanadium and titanium.

U.S. Pat. No. 4,943,343 describes a self-aligned gate process for making field emitters which includes forming conical emission tips on a substrate, depositing oxide on the tips, depositing gate metal on the oxide, depositing photoresist on the gate metal, etching the resist to expose gate metal above the tips, etching the exposed gate metal, removing the resist, and etching the exposed oxide to expose the emission tips.

A primary shortcoming and deficiency in much of the prior art is the inability to form fine conical or pyramid shaped features or emission tips without photolithography. Prior attempts to fabricate graded microtips without photolithography have included the following:

U.S. Pat. No. 4,465,551 discloses depositing a globular layer material onto a surface such that the material self-agglomerates into a layer of non-uniform thickness. The globular material may be formed as separate islands of randomly located etch mask material. The globular materials set forth are either polymerized monomers or metals of relatively low melting points such as aluminum evaporated onto a heated surface. An etch forms a graded-index layer which is useful in optical reflection reduction. It is often necessary to deposit an intermediate layer between the surface and the globular layer in order to assure proper globular layer formation. Moreover, a reactive etch is always used, that is, the etch is performed in the presence of a gas which reacts with the surface to accelerate the etch and increase the etch rate ratio. Although the basic theory of this method appears to be sound, in practice this method has a number of serious drawbacks. Reactive etching tends to be expensive and demands precise control over the flow of gas. For cost-effective manufacturing it is highly desirable to eliminate reactive gases. Furthermore, an appropriate combination of globular material and reactive gas must be selected to achieve a desired etch rate, which further limits the choice of globular materials.

U.S. Pat. No. 4,806,202 discloses a plasma etch process utilizing an oxide etcher with high energy ion bombardment and an aluminum electrode. Sputtered aluminum from the electrode occurs on the surface oxide and blocks some of the etching due to the anisotropic nature of the etch. As a result, grass like oxide residue is formed. A drawback, however, is that high energy ions are directed simultaneously to the oxide surface and the aluminum electrode. Thus, the oxide surface is subjected to etching before the aluminum is liberated from the aluminum electrode to form the etch mask. In addition, reactive etching is used, and sputtering aluminum is not generally scalable to depositing on large area substrates and tends to produce relatively non-uniform layers. Moreover, the grass like oxide residue lacks the pyramid type shape necessary for adequate field enhancement during field emission.

Therefore there still exists a need for relatively simple methods of making sub-micron pyramid shaped field emission tips of low work function materials without the use of photolithography.

SUMMARY OF THE INVENTION

An object of the present invention is a process for fabricating field emission tips with sharp sub-micron features without requiring photolithography.

Another object of the present invention is to provide high-efficiency large-area field emitter devices containing low work function emission tips which require only a relatively small voltage for field emission to occur.

Still another object of the present invention is a process for fabricating field emission tips which uses relatively few process steps.

The present invention accomplishes these objectives by physical vapor deposition of randomly located discrete nuclei to form a discontinuous etch mask. The nuclei are preferably non-polymerized with a relatively high melting point to assure an ion etch produces pyramid shaped tips with a suitable enhancement factor. In a first embodiment an etch is applied to low work function material covered by randomly located nuclei to form emission tips in the low work function material. In a second embodiment an etch is applied to a base material covered by randomly located nuclei to form tips in the base material which are then coated with low work function material to form emission tips. Diamond is the preferred low work function material.

The present invention advantageously makes use of thin film technology principles which have been known and studied for many years and published in several books. See, for instance, Maissel and Glang, HANDBOOK OF THIN FILM TECHNOLOGY, 1983 Reissue, McGraw-Hill Book Company, which is incorporated herein by reference.

Another advantage of the present invention is the relative ease and simplicity of the process steps compared to photolithography.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

First Embodiment

Figure 1A:
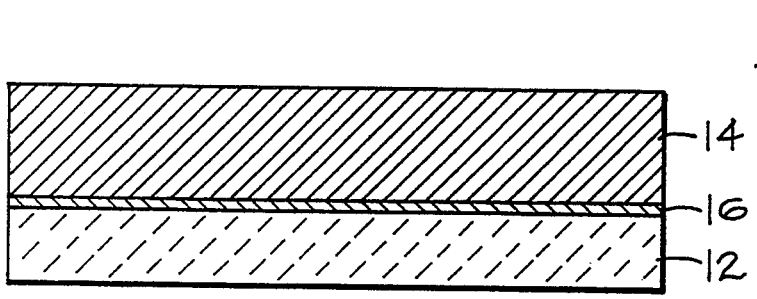
FIGS. 1A–1D show cross-sectional views of successive stages of fabricating a field emitter device in accordance with a first embodiment of the present invention.

Referring now to the drawings wherein depicted elements are not necessarily shown to scale and wherein like or similar elements are designated by the same reference numeral through the several views, and more particularly to FIGS. 1A–1D, there are shown successive cross-sectional views of fabricating a field emitter device generally designated 10 according to a first embodiment of the present invention.

With reference now to FIG. 1A, a large area substrate 12 with a planar top surface is provided. Substrate 12 is preferably glass, silicon or a metal although other materials can be used, the requirement being they provide a base upon which a plurality of emission tips can be fabricated. A continuous layer of a low work function material 14 is disposed on substrate 12. A low work function material for the present invention must be 4.5 electron-volts or less, preferably 2.5 electron-volts or less. Diamond (amorphic or nanocrystalline) is the preferred low work function material; see, for instance, U.S. Pat. Nos. 5,199,918; 5,180,951; and 5,141,460; as well as U.S. application Ser. Nos. 08/147,700 filed Nov. 4, 1993; 08/071,157 filed Sep. 2, 1993; 07/995,846 filed Dec. 23, 1992; 07/993,863 filed Dec. 23, 1992; and 07/851,701 filed Mar. 16, 1992; each of which is incorporated herein by reference. Other suitable low work function materials include tri-chromium mono-silicon ($Cr_3Si$), tantalum-nitride (TAN), low work function compounds, metals (cesium) and cermets (e.g., trichromium mono-silicon silicon-dioxide ($Cr_3Si$—$SiO_2$), trichromium mono-silicon magnesium-oxide ($Cr_3Si$—MgO), gold silicon-dioxide (Au—$SiO_2$), and gold magnesium-oxide (Au—MgO)). Low work function material 14 may be deposited on substrate 12, for instance, by sputtering, evaporation (including magnetically filtered cathode arc evaporation), laser deposition or chemical vapor deposition although the preferred technique depends on the particular material. The preferred deposition techniques for diamond films are disclosed in U.S. Pat. Nos. 5,098,737 and 4,987,007. An optional adhesion layer 16 such as 500 angstroms titanium, chromium, tantalum, titanium-tungsten or nickel-chromium can be deposited between substrate 12 and material 14.

Figure 1B:
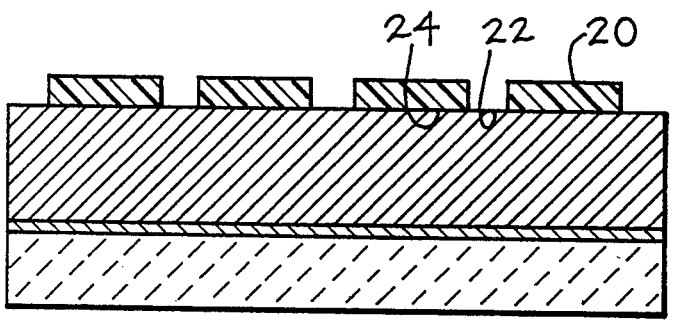

Referring now to FIG. 1B, an etch mask 20 of randomly dispersed nuclei is deposited by physical vapor deposition on material 14. Discontinuities between the nuclei are formed in situ as mask 20 is deposited, as opposed to depositing a blanket layer and then selectively patterning openings such as by photolithography. More particularly, etch mask 20 is formed by depositing in situ a discontinuous layer of randomly located, spaced, discrete nuclei with discontinuities therebetween so as to form etch mask 20 on low work function material 14 thereby exposing some portions of the low work function material 14 (beneath the discontinuities) while covering other portions of material 14 (beneath the nuclei). The random location of the nuclei ensures that the locations of the discontinuities, the exposed and covered portions of material 14, and the pattern of mask 20 are random as well. As may be seen, mask 20 serves to expose portions 22 of material 14 while covering portions 24 of material 14. Mask 20 must be deposited by physical vapor deposition, such as by ionized metal cluster beams, liquid metal cluster beams, sputtering (including ion beam sputtering and magnetic ion beam sputtering) or evaporation.

Those skilled in the art recognize that physical vapor deposition is distinct from chemical vapor deposition. In physical vapor deposition, as used herein, particles moving toward a substrate either fail to react or combine with a gas to form an oxide, nitride, carbide or the like. For instance, physical vapor deposition of a compound of a metal and a gas onto a surface is described in U.S. Pat. No. 5,196,102 which is incorporated herein by reference. Physical vapor deposition does not require chemical reduction of a vapor in contact with a substrate. Thus, physical vapor deposition does not encompass photodecomposition of a gaseous precursor (whether by blanket illumination through a photomask or by direct-write of a laser beam) or electron beam decomposition of a gas phase material at a substrate. Moreover, physical vapor deposition avoids the need for highly uniform vapor composition and flow (which limits maximum substrate size) and toxic organo-metallic precursors, as typically required by chemical vapor deposition.

In the present invention, suitable mask materials include aluminum-oxide ($Al_2O_3$), molybdenum, gold, and allotropic forms of carbon (including diamond and graphite). For example, diamond particles on the order of 50 angstroms diameter may be sprinkled on the substrate. It is noted that these mask materials are non-polymerized materials with relatively high melting points (i.e., above the melting point of aluminum and preferably above approximately 1000° C.) to assure properly shaped emission tips. Aluminum-oxide has a very low sputtering yield (i.e., for an incoming atom how many atoms are etched off). A low sputtering yield in mask 20 relative to material 14 allows deep valleys to be etched in material 14 while using a relatively thin etch mask 20. Sputtering yields of various materials in argon are tabulated on p. 4–40 in *Maissel and Glang*.

The discontinuities extending through the thickness of etch mask 20 are formed in situ as physical vapor deposition occurs using techniques known to those having skill in the art. For instance, *Maissel and Glang* at p. 8–33 report a nucleation and growth model in which a thin film having a thickness of 100 angstroms or less is generally discontinuous. Furthermore, *Maissel and Glang* report experimental verification of this model at pp. 10–42 and 10–43. In *Maissel and Glang* the nucleation site is a random site where the first set of atoms/molecules reside during the initial formation of a thin film on a substrate. A majority (if not essentially all) of the nuclei grow as deposition occurs. Growth of the nuclei is three-dimensional although growth parallel to the substrate may be greater than growth normal to it. Moreover, the majority (if not essentially all) of growth of the nuclei does not result from coalescence of the nuclei. Even though the number and sizes of the nuclei which comprise the discontinuous thin film layer depend on substrate temperature, activation of nuclei adatoms, and duration of deposition, under proper conditions it is possible to accurately control the size of the nuclei. For instance, FIG. 21(a) on p. 10–42 of *Maissel and Glang* shows a large number of discrete three-dimensional nuclei in which the width of each nucleus is less than 1000 angstroms and each nucleus is spaced by a discontinuity of less than 1000 angstroms from the nearest adjacent nucleus. A thin film less than 10 angstroms thick may fail to provide a reliable etch mask 20. Therefore, a discontinuous layer of etch mask between 10 and 100 angstroms thick is generally preferred.

Figure 1C:
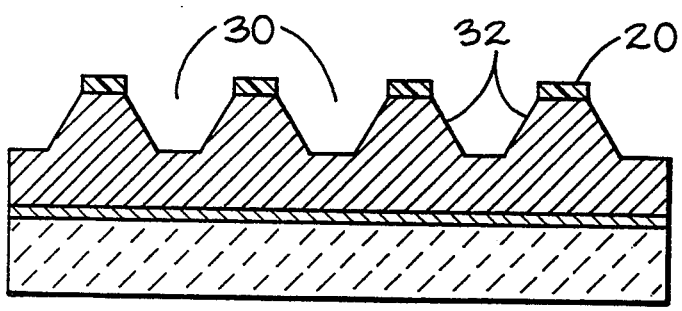

With reference now to FIG. 1C, an etch is applied to the top of device 10 to remove portions of material 14 exposed by mask 20. Ion etching (which includes dry etching and plasma etching) is preferred and is illustrated herein. Wet chemical etching, for example, is not normally preferred due to undercutting of material 14 beneath the mask. Likewise, a reactive etch (where a gas reacts with the surface to accelerate the etch) is normally unnecessary in the present invention. It should be noted that mask 20 need not be erodible by the etch to form pyramid shaped emission tips since "shadowing" may occur whereby ions are deflected from the edge of the mask thereby accelerating the etch rate of exposed material spaced from the edges of the openings in the mask. Thus, under appropriate conditions the emission tips may be formed using a non-erodible etch mask.

Returning to the example, material 14, mask 20 and the ion etch are selected so that as the ion etch is applied mask 20 erodes slowly and material 14 etches at a greater rate than mask 20. For practical purposes, material 14 must etch at a greater rate than mask 20. Preferably, material 14 etches at at least twice the rate of mask 20. As a result, vertical valleys 30 formed at the exposed portions 22 extend partially through material 14, preferably between 100 angstroms and 1 micron deep, although if desired valleys 30 could extend completely through material 14. As is seen, randomly located emission tips 32 are formed between valleys 30. Preferably, the distance between adjacent tips exceeds the height of the tips for field enhancement purposes.

Figure 1D:
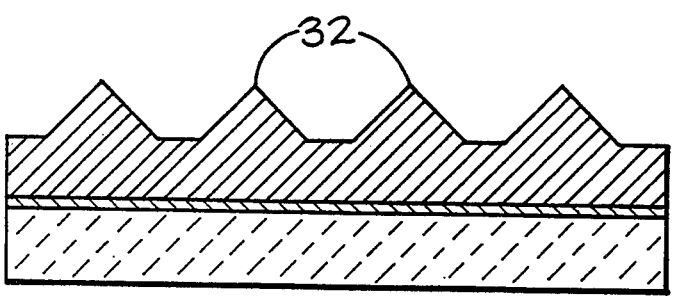

Referring now to FIG. 1D, the ion etch is continued so as to completely remove mask 20 and deepen the valleys. Emission tips 32 eventually assume a conical-pyramid shape with pointed tops due to preferential etching of the grain boundaries as has been previously demonstrated by heavy ion bombardment of copper films. In the event the low work function material 14 contains different materials with different etch rates the ion etch should be carefully monitored to prevent completely removing one material thereby changing the work function of the material which remains on the substrate. For example, ion etching tantalum-nitride may remove all the nitride leaving a tantalum layer with too high a work function.

Alternatively, if desired, the ion etch can be halted before mask 20 is completely removed. The remainder of mask 20 may then be removed by a second etch, such as wet chemical etching or dry etching, without removing additional material 14. The resultant emission tips would assume a rectangular-pyramid shape with relatively flat tops, as seen in FIG. 1C. This would not normally be preferred, however, since the conical-pyramid shape most enhances the electrical field distribution near the emission surface as field emission occurs.

While the relative simplicity of the embodiment in FIGS. 1A–1D is advantageous, certain difficulties may also arise. For instance, there may be only a small difference in the etch rates between the low work function material 14 and an aluminum-oxide mask 20. A limited thickness needed for a discontinuous mask 20 deposited in situ might severely limit the depth of valleys 30. Furthermore, certain low work function materials such as compounds or cermets may be destroyed by ion etching.

Second Embodiment

With reference now to FIGS. 2A–2E, there are shown successive cross-sectional views of fabricating a field emitter device 40 according a second embodiment of the present invention which overcomes the previously described difficulties for the embodiment in FIGS. 1A–1D at the cost of added complexity.

Figure 2A:
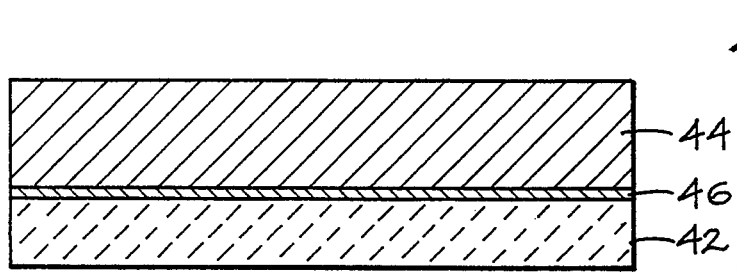
FIGS. 2A–2E show cross-sectional views of successive stages of fabricating a field emitter device in accordance with a second embodiment of the present invention.

Referring now to FIG. 2A, a relatively thick (1000 angstroms to 3 microns) continuous layer of base material 44 is sputter deposited on a substrate 42 (similar to substrate 12) with optional adhesion layer 46 (similar to adhesion layer 16) sandwiched therebetween. A preferred base material 44 is an electrical conductor such as 3 micron thick copper, although resistive or semiconductive base materials are also suitable.

Figure 2B:
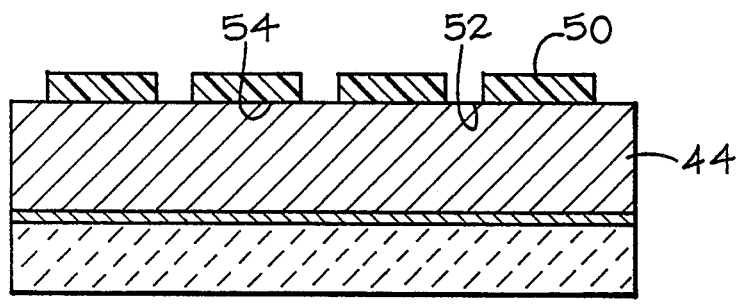

With reference now to FIG. 2B, a discontinuous layer of an etch mask 50 (similar to mask 20) is deposited on base material 44 such that the discontinuities are formed in situ between randomly scattered nuclei as deposition occurs, thereby exposing portions 52 of material 44 while covering portions 54 of material 44. The same materials, thicknesses, deposition techniques and so on described previously for mask 20 apply to mask 50.

Figure 2C:
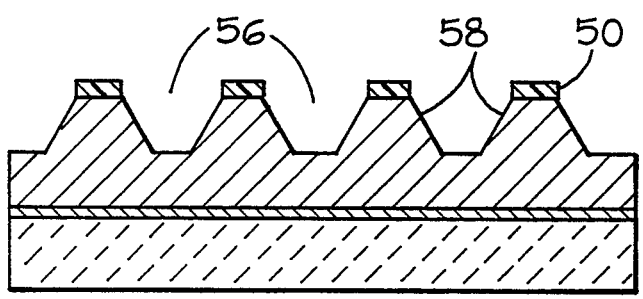

Referring now to FIG. 2C, an etch (illustrated as an ion etch) is applied to the top of device 40. Material 44, mask 50 and the ion etch are selected such that material 44 etches at a greater rate than mask 50, preferably at at least twice the etch rate. As a result, vertical valleys 56 formed at the exposed portions 52 extend partially through material 44, and tip bases 58 are formed between valleys 56. If desired, valleys 56 could extend completely through material 44. With 1000 electron-volt argon ions in the present illustration the large difference in sputtering yields of an aluminum-oxide mask 50 and copper base material 44 (0.04 and 3.2, respectively) produces very high aspect ratios for valleys 56.

Figure 2D:
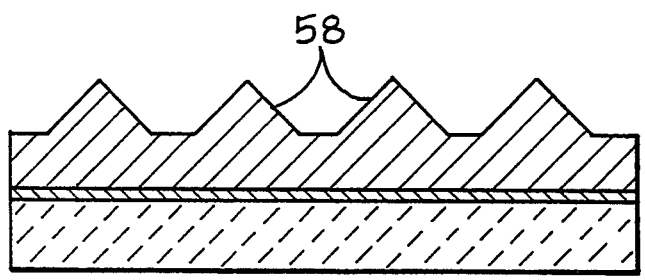

With reference now to FIG. 2D, the ion etch is continued so as to completely remove mask 50. In addition, base tips 58 assume a conical-pyramid shape.

Figure 2E:
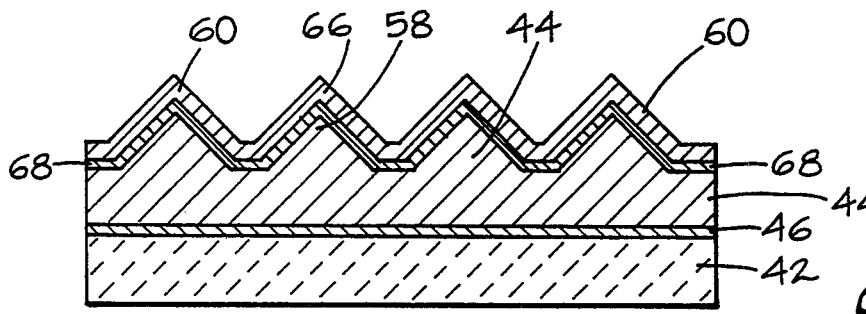

Referring now to FIG. 2E, a coating of low work function material 60 (similar to material 14) is deposited on base material 44, thereby forming randomly located conical-pyramid shaped emission tips 66 on base tips 58. An optional adhesion layer 68 (similar to adhesion layer 16) can be sandwiched between materials 44 and 60 if desired.

Alternatively, as previously described, the ion etch could be halted before completely removing mask 50, and a wet chemical etch or dry etch could remove the rest of mask 50 without removing additional base material 44 prior to depositing low work function material 60 thereon. However, the resultant base tips 58 and emission tips 66 would assume the rectangular-pyramid shape seen in FIG. 2C which, as mentioned above, is not normally preferred.

Furthermore, in the embodiment of FIGS. 2A–2E it is not essential that the mask be completely removed since low work function material 60 is coated on the substrate after the mask is formed. Thus (although not shown), emission tips 66 may include mask 50 sandwiched between materials 44 and 60 if desired.

Figure 3:
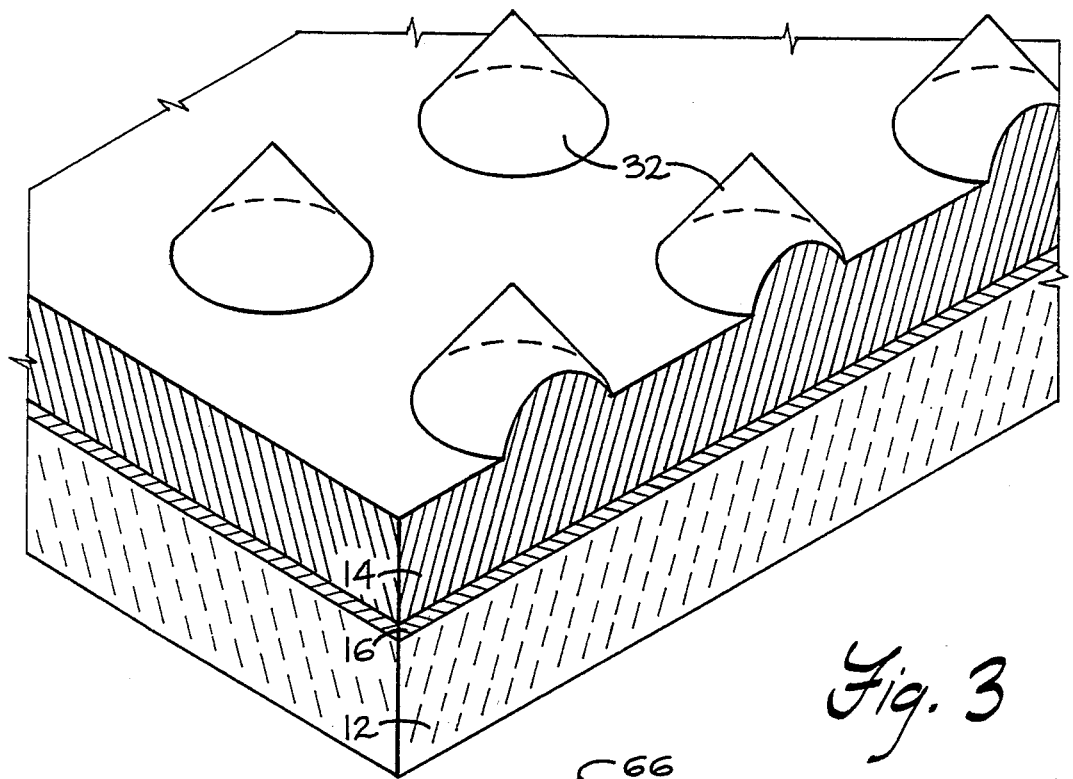
FIG. 3 shows an elevational perspective view of a field emitter device fabricated in accordance with FIGS. 1A–1D.
Figure 4:
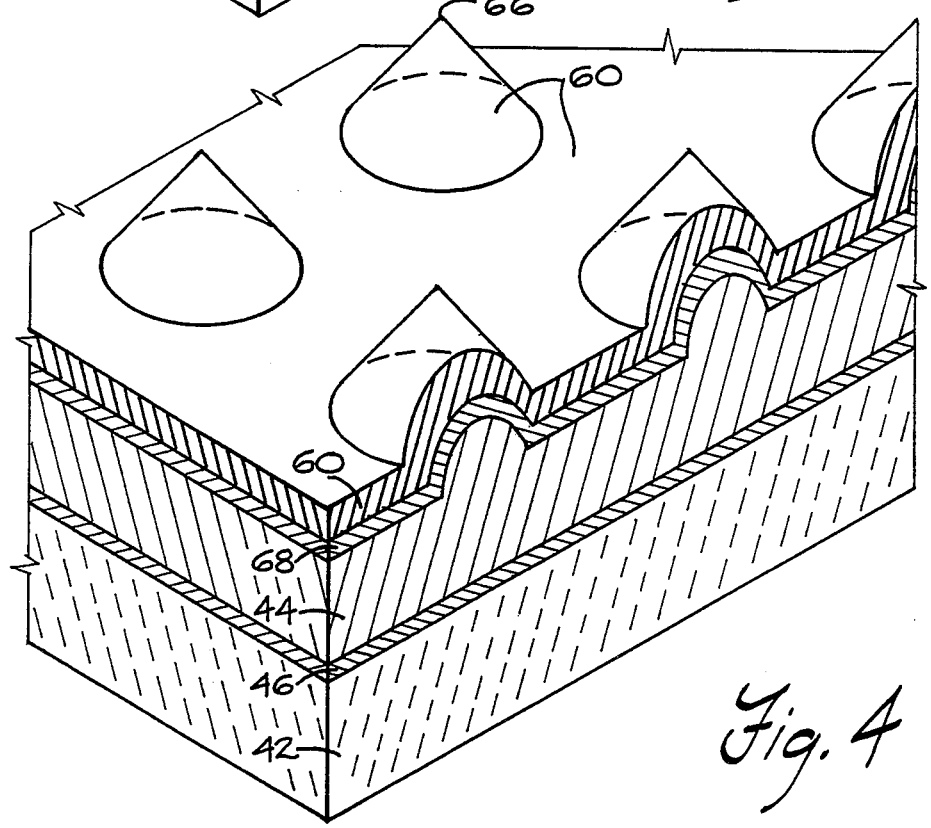
FIG. 4 shows an elevational perspective view of a field emitter device fabricated in accordance with FIGS. 2A–2E.

With reference now to FIGS. 3 and 4, elevational perspective views are shown of field emitter devices fabricated in accordance with FIGS. 1A–1D and 2A–2E, respectively.

Other such possibilities should readily suggest themselves to persons skilled in the art. For example, the emission tips could assume circular or irregular pyramid shapes. Furthermore, the emission tips may be used as cold cathodes in a wide variety of systems and devices such as flat panel displays. In addition, the present invention may suitably comprise, consist of, or consist essentially of the forementioned process steps.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of making field emission tips, comprising the following steps:
   disposing a continuous layer of a low work function material over a substrate;
   depositing in situ by physical vapor deposition a non-polymerized randomly patterned etch mask with a relatively high melting point over the low work function material, said etch mask consisting essentially of randomly located discrete nuclei with discontinuities therebetween formed as deposition occurs without coalescence of the nuclei thereby exposing portions of the low work function material beneath the discontinuities;
   etching the exposed portions of the low work function material; and
   removing the etch mask thereby forming exposed emission tips of low work function material.

2. A method of making field emission tips, comprising the following steps:
   disposing a continuous layer of a base material over a substrate;
   depositing in situ by physical vapor deposition a non-polymerized randomly patterned etch mask with a relatively high melting point over the base material, said etch mask consisting essentially of randomly located discrete nuclei with discontinuities therebetween formed as deposition occurs without coalescence of the nuclei thereby exposing portions of the base material beneath the discontinuities;
   etching the exposed portions of the base material to form tips in the base material; and
   depositing a low work function material over the tips in the base material thereby forming exposed emission tips of low work function material.

3. The method as recited in claims 1 or 2 wherein the substrate is selected from the group consisting of glass, silicon and a metal.

4. The method as recited in claims 1 or 2 wherein the low work function is less than 4.5 electronvolts.

5. The method as recited in claims 1 or 2 wherein the low work function material is diamond.

6. The method as recited in claims 1 or 2 wherein the etch mask is selected from the group consisting of aluminum-oxide, molybdenum, gold, carbon, graphite, and diamond.

7. The method as recited in claims 1 or 2 wherein the height of the emission tips is at least one micron.

8. The method as recited in claims 1 or 2 wherein the distance between adjacent emission tips exceeds the height of the emission tips.

9. The method as recited in claims 1 or 2 wherein the melting point of the nuclei is at least 1000° C.

10. The method as recited in claims 1 or 2 wherein the physical vapor deposition is provided by one of an ionized metal cluster beam, a liquid metal cluster beam, evaporation or sputtering.

11. The method as recited in claims 1 or 2 wherein the exposed portions etch at a greater rate than the etch mask.

12. The method as recited in claims 1 or 2 wherein the etching is by an ion etch.

13. The method as recited in claims 1 or 2 wherein the etching is without reactive gases.

14. The method as recited in claims 1 or 2 wherein the emission tips assume a pyramid shape.

15. The method as recited in claims 1 or 2 wherein the etching removes all of the etch mask and the emission tips assume a conical-pyramid shape.

16. The method as recited in claims 1 or 2 wherein the etching removes a portion of the etch mask without removing a remaining portion of the etch mask, a second etch removes the remaining portion of the etch mask and the emission tips assume a rectangular-pyramid shape.

17. The method as recited in claims 1 or 2 wherein the etching begins after the deposition of nuclei begins.

18. The method as recited in claims 1 or 2, further comprising installing the emission tips as cold cathodes in a flat panel display.

19. The method as recited in claim 2 wherein the etch mask is completely removed and the low work function material is deposited on the base material.

20. The method as recited in claim 2 wherein the etch mask is not completely removed and the low work function material is deposited on the etch mask.

21. A method of making diamond emission tips without photolithography, comprising the following steps:
   providing a substrate;
   depositing a continuous layer of a diamond on the substrate;
   depositing in situ by evaporation or sputtering a non-polymerized randomly patterned etch mask with a relatively high melting point on the diamond, said etch mask consisting essentially of randomly located discrete nuclei with discontinuities therebetween formed as deposition occurs without coalescence of the nuclei thereby exposing portions of the diamond beneath the discontinuities while covering other portions of the diamond beneath the nuclei;
   etching the exposed portions of the diamond by applying an ion etch after the deposition of nuclei begins, wherein the diamond etches at a greater rate than the etch mask so as to form valleys in the diamond with diamond emission tips therebetween; and
   removing all of the etch mask thereby exposing the diamond emission tips.

22. A method of making diamond emission tips without photolithography, comprising the following steps:
   providing a substrate;
   depositing a continuous layer of a base material on the substrate;
   depositing in situ by evaporation or sputtering a non-polymerized randomly patterned etch mask with a relatively high melting point on the base material, said etch mask consisting essentially of randomly located discrete nuclei with discontinuities therebetween formed as deposition occurs without coalescence of the nuclei thereby exposing portions of the base material beneath the discontinuities while covering other portions of the base material beneath the nuclei;
   etching the exposed portions of the base material by applying an ion etch after the deposition of nuclei begins, wherein the base material etches at a greater rate than the etch mask so as to form valleys in the base material with base tips between the valleys; and then
   depositing diamond over the base material thereby forming exposed diamond emission tips between the valleys.

23. The method of claims 1 or 2 or 21 or 22 wherein the etch mask consists of the nuclei.

* * * * *